United States Patent [19]

Lherm et al.

[11] Patent Number: 4,935,657

[45] Date of Patent: Jun. 19, 1990

[54] MARX GENERATOR AND SPARK-GAP ASSEMBLY FOR SUCH A GENERATOR

[75] Inventors: André Lherm, Le Haillan; Bernard Raveu, St. Medard en Jalles, both of France

[73] Assignee: Aerospatiale Societe Nationale Industrielle, Paris, France

[21] Appl. No.: 400,106

[22] Filed: Aug. 29, 1989

[30] Foreign Application Priority Data

Sep. 28, 1988 [FR] France .................. 88 12661

[51] Int. Cl.⁵ .................. H01G 4/38; H02M 3/18
[52] U.S. Cl. .................. 310/309; 310/71; 313/325; 361/329
[58] Field of Search .................. 250/417; 307/110, 116; 310/42, 43, 71, 309; 313/128, 325; 361/329; 378/103

[56] References Cited

U.S. PATENT DOCUMENTS

| | | | |
|---|---|---|---|
| 3,248,574 | 4/1966 | Dyke et al. .................. | 307/110 |
| 3,783,289 | 1/1974 | Hafner .................. | 378/103 |
| 4,056,753 | 11/1977 | Keikichi et al. .................. | 313/325 |
| 4,672,259 | 6/1987 | Riggins et al. .................. | 313/325 |
| 4,680,671 | 7/1987 | Brion et al. .................. | 361/329 |
| 4,837,661 | 6/1989 | Lherm et al. .................. | 361/329 |

FOREIGN PATENT DOCUMENTS 0162766 11/1985 European Pat. Off. .
2184187 12/1973 France .

OTHER PUBLICATIONS

Japanese Journal of Applied Physics, vol. 20, No. 12, (Dec. 1981), pp. 2397 to 2400.
Instruments and Experimental Techniques, vol. 19, No. 5, Part 1, (Sep./Oct. 1976), pp. 1375 to 1377.

Primary Examiner—Peter S. Wong
Assistant Examiner—D. L. Rebsch
Attorney, Agent, or Firm—Fisher, Christen & Sabol

[57] ABSTRACT

The present invention provides a Marx generator comprising:
- a sealed case inside which prevails an atmosphere of a dielectric gas,
- a plurality of capacitor stages connected by a plurality of electrodes to two annular terminals connected to pairs of associated spark-gap heads. The spark-gap heads of each of said pairs of associated spark-gap heads are mounted on the same insulating support so as to be connected mechanically together.

16 Claims, 5 Drawing Sheets

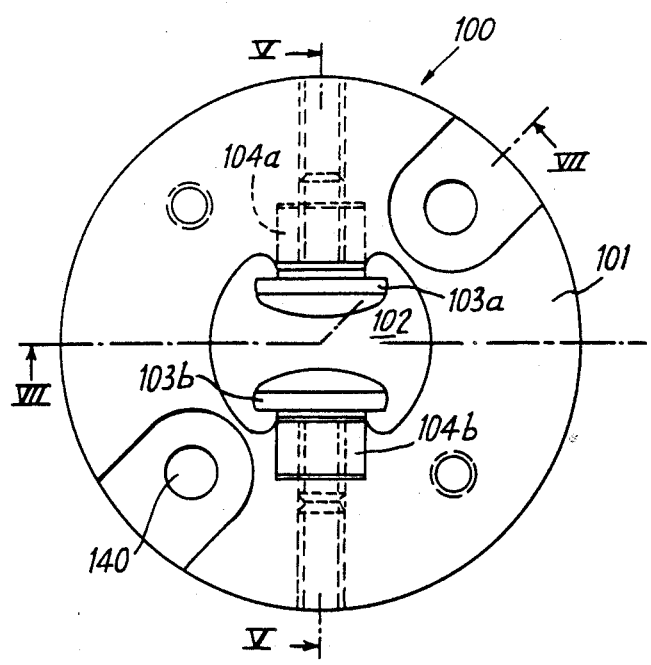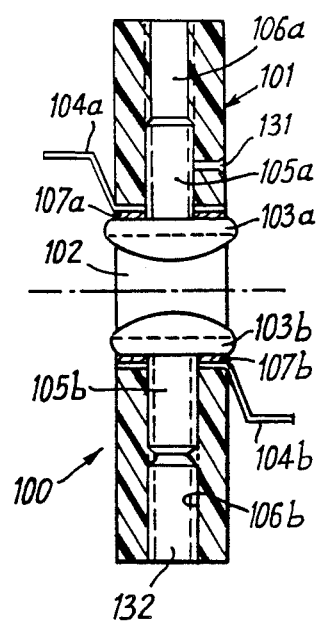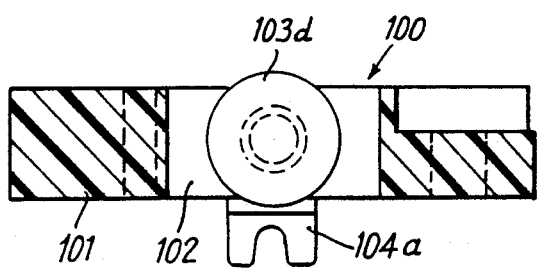

MARX GENERATOR AND SPARK-GAP ASSEMBLY FOR SUCH A GENERATOR

BACKGROUND OF THE INVENTION

1. Field of the Invention

The present invention relates to a Marx generator.

A Marx generator comprises several capacitor stages which are charged in parallel and discharged in series. Each capacitor stage may be charged at voltages greater than several hundred kilovolts, so that the voltage and the energy available at the output of said generator may respectively reach a few Megavolts and a few tens of kilojoules.

2. Description of the Prior Art

For example, in the French patent application 87 14374 in the name of the Applicant, a Marx generator is described comprising:

a sealed case inside which prevails an atmosphere of a dielectric gas, a plurality of capacitor stages, of toric shape, arranged in said case coaxially to a common axis and juxtaposed along said axis, each capacitor stage having a capacitor embedded in a dielectric coating, in the form of a ring, and connected by a plurality of electrodes to two annular terminals coaxial with said axis, said annular terminals being connected respectively to spark-gap heads housed in the central recess of the capacitor stages, each capacitor stage comprising two spark-gap heads, one of which cooperates with a spark-gap head of the preceding stage and the other cooperates with a spark-gap head of the following stage so as to form each time a pair of associated spark-gap heads.

Such a Marx generator is generally satisfactory in use.

However, in this case, each spark-gap head is connected to a corresponding terminal of the capacitor stage to which said spark-gap head belongs. That leads to the following drawbacks.

In fact, the position of a spark-gap head is adjusted with respect to a theoretical reference (axis) of the capacitor stage to which said spark-gap head belongs. Then, two adjacent stages, each having two semi spark-gaps, are assembled and the respective spark-gap heads are then opposite one another, without it being possible to take action either in so far as the spacing is concerned or their coaxiality.

However, during assembly, the spacing and alignment of the heads may vary randomly if there are mechanical clearances, dimensional spread or clamping stresses, all the more so the higher the number of parts present.

Furthermore, the different dynamic forces brought into play during operation of the generator may cause displacements which modify the position and spacing of the spark-gap heads.

Thus, variations of the triggering characteristics of the Marx generators of the above type are created, which adversely affect their operating reliability.

SUMMARY OF THE INVENTION

The aim of the present invention is to avoid the above drawbacks and relates to a Marx generator whose reliability, i.e. the consistency of the firing results, is improved.

For this, the Marx generator of the above specified type is remarkable, in accordance with the invention, in that the spark-gap heads of each of said pairs of associated spark-gap heads are mounted on the same insulating support, so as to be connected mechanically together.

Although said pairs of associated spark-gap heads may each be initially connected to a spark-gap stage and then connected to the adjacent stage, it is advantageous for each pair of associated spark-gap heads to form a single unit removably housed in a recess provided at the interface of two consecutive stage, said recess being in particular formed of two recess halves formed respectively in one and other of said consecutive stages.

Thus, each pair of associated spark-gap heads forming a single spark-gap unit:

is mechanically independent of the two capacitor stages which which it is associated, makes possible the precise adjustment of the spacing of the spark-gap heads, before they are fixed to said stages, ensures the alignment and coaxiality of the spark-gap heads, makes is possible to absorb the deformations due to the dynamic forces generated by the firing, without adversely affecting the spacing of the spark-gap heads.

Advantageously, each pair of associated spark-gap heads comprises two spark-gap head bodies disposed opposite each other respectively on each side of the axis common to the capacitor stages and symmetrically with respect to said axis.

In addition, each spark-gap head body may be connected to the corresponding electrode by a bent connecting strip, connecting each head body electrically to the stage to which said spark-gap head belongs.

Preferably, said insulating support is in the form of a torus, in the central recess of which said head bodies are mounted.

In particular, each spark-gap head body is provided with a threaded rod, by means of which it may be mounted in a corresponding bore of said support.

Advantageously, said connecting strip is clamped between the base of the spark-gap head body and the corresponding surface portion of the central recess of the insulating support.

Preferably, between the base of the spark-gap head body and said corresponding surface portion of the central recess of the insulating support, a shim is provided for adjusting the spacing of the head bodies.

The present invention also relates to a spark-gap assembly for a Marx generator of the above mentioned type, remarkable in accordance with the invention in that said spark-gap assembly is formed of a pair of associated spark-gap heads mounted on the same insulating support, so as to form a single unit.

Advantageously, said insulating support is in the form of a torus, in the central recess of which the two respective head bodies of said pair of associated spark-gap heads are mounted facing each other, which head bodies are intended to be connected respectively to two adjacent capacitor stages of said generator.

The present invention also relates to a method of fitting a spark-gap assembly in a Marx generator defined above, said spark-gap assembly, forming a single unit, being formed of said pair of spark-gap heads mounted on the same insulating support in the form of a torus, in the central recess of which the two respective head bodies of said pair of spark-gap heads are disposed facing each other, which bodies are intended to be connected respectively by a bent connecting strip to two adjacent capacitor stages of said generator, which method is remarkable by the following steps:

the spacing of the spark-gap head bodies is previously adjusted, a first head body is removed, by freeing its connecting strip which is mounted on the corresponding terminal of the capacitor stage to be equipped, then, in the recess provided for this purpose in said stage, is mounted the spark-gap assembly provided with the second head body, the first head body is then replaced on the assembly by nipping the associated connecting strip between the head body and the support, then, the next capacitor stage is fitted, the toric support providing centering on the spark-gap assembly, and the connecting strip of the second head body is fixed on the connecting terminal of the last capacitor stage fitted.

Advantageously, the first head body may be locked by injecting therein a blocking product.

BRIEF DESCRIPTION OF THE DRAWINGS

The figures of the accompanying drawings will better show how the invention may be implemented. In these figures, identical references designate similar elements.

FIG. 5 is a sectional view through line V—V of FIG. 6;

FIG. 6 is front view of a spark-gap assembly according to invention;

FIG. 7 a sectional view through line VII—VII of FIG. 6;

FIG. 8 is a top view of a connecting strip;

DESCRIPTION OF THE PREFERRED EMBODIMENTS

Figure 1:
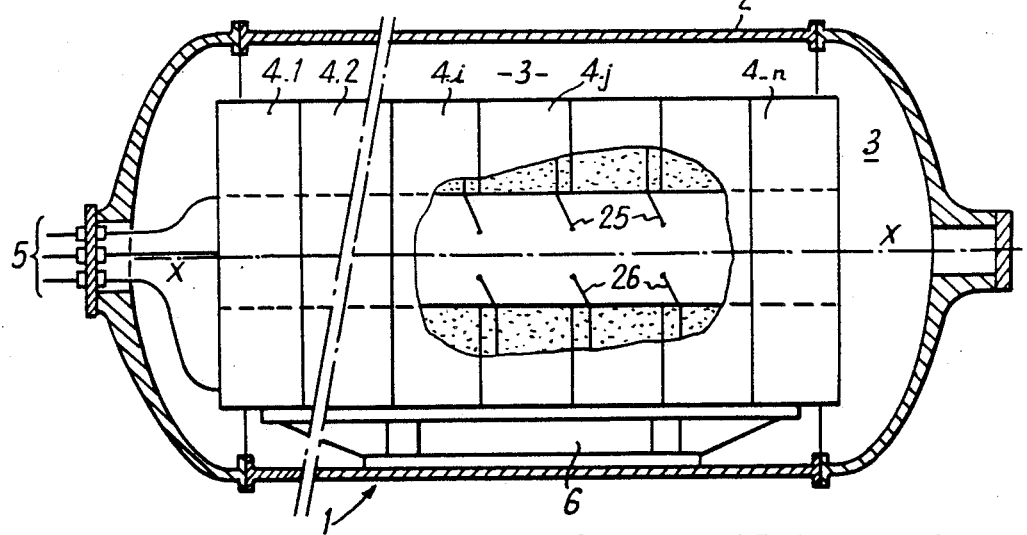
FIG. 1 is a schematic longitudinal section of a Marx generator.

The Marx generator 1, shown schematically in FIG. 1, comprises conventionally a sealed case 2, inside 3 of which there prevails an atmosphere of a dielectric gas, e.g. sulfur hexafluoride SF6. In case 2 are arranged a plurality of capacitor stages 4.1, 4.2, . . . 4.i, 4.j, . . . 4.n which, as can be best seen in FIGS. 2 and 3, each have the form of a torus of rectangular section. These capacitor stages are all mounted coaxially to a common axis X—X and are juxtaposed along said axis. In a way known per se and not shown, said capacitor stages are connected electrically with each other, particularly through resistors not shown, so as to be charged in parallel then discharged in series. In addition, electric connections 5 connect said capacitor stages to electric control devices, not shown, external to case 2.

Furthermore, the capacitor stages 4.1 to 4.n are mechanically interconnected and their assembly is mechanically carried by a support or several supports 6, joining them to case 2. For example, the common axis X—X is horizontal and support 6 forms a base which supports the capacitor stages and which is itself supported by case 2.

Figure 2:
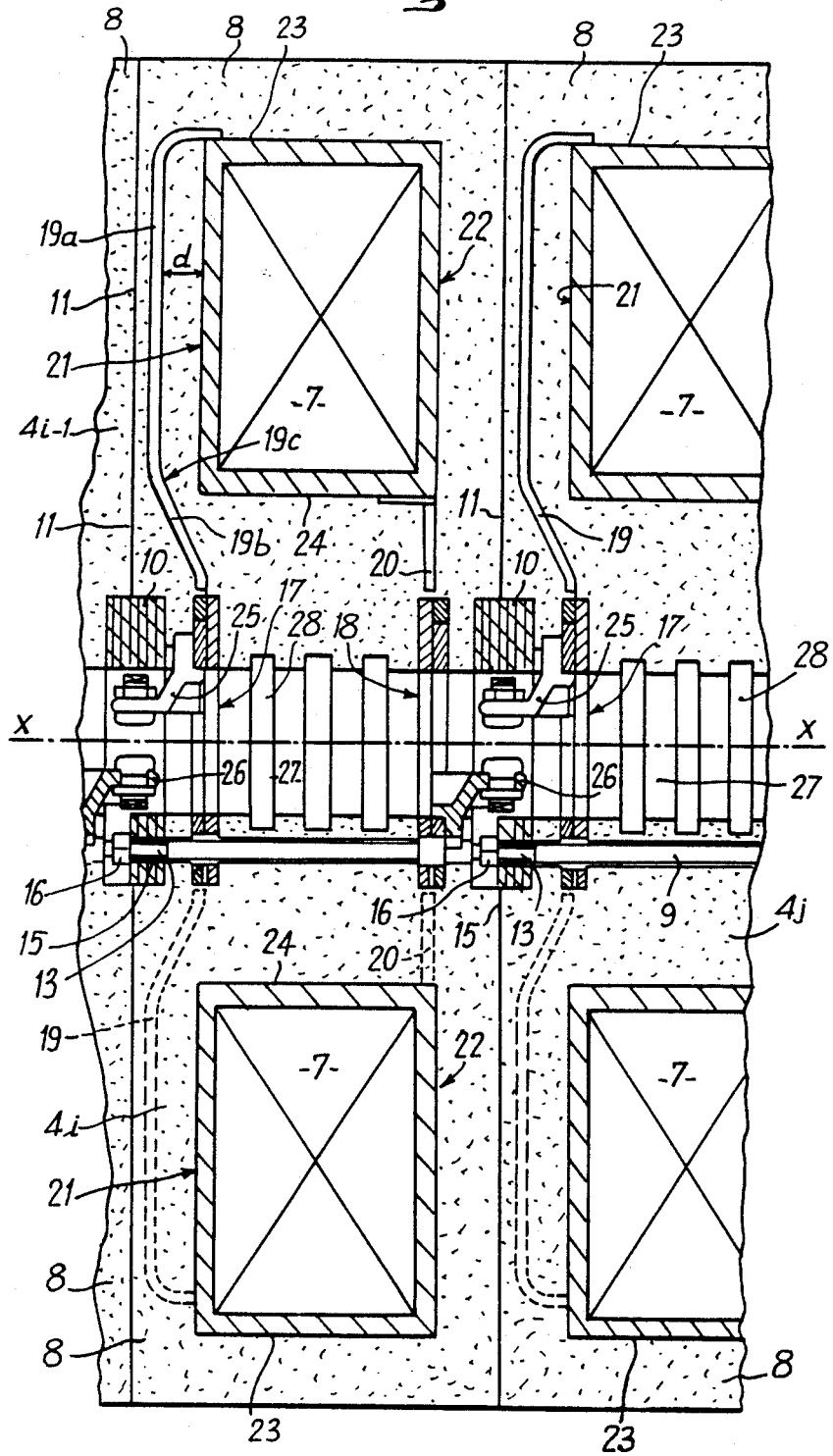
FIG. 2 is a diametrical section, on a larger scale, illustrating the structure of a capacitor stage and its connection with the adjacent stages, in a known Marx generator.

In FIG. 2, any one 4.i of said capacitor stages has been shown schematically in axial section, as well as partially the capacitor stages 4.i-1 and 4.j which are disposed respectively on each side of said stage 4.i.

As can be seen, each capacitor stage comprises a capacitor 7 in the form of a ring, centered on axis X—X and embedded in a dielectric resin coating 8.

Coatings 8 themselves are in the shape of a ring coaxial to the axis X—X and comprise end faces 11 by which they may bear against each other.

The consecutive capacitor stages are connected mechanically together by connecting tie-rods 9, bearing on centering rings 10. Each centering ring 10 fits into central facing recesses provided in the end bearing faces 11 of the consecutive coatings 8. Each tie-rod 9 is provided at each of its ends with threaded portions 13 which either screw into tappings in said rings 10 or pass freely through bores 15 therein. Pressure screws 16 are screwed on to the threaded portions 13. Each ring 10 comprises tappings and bores 15.

In FIG. 2, the electric connections between the consecutive capacitor stages have not been shown. On the other hand, the terminals 17 and 18 of each capacitor stage and the corresponding electrodes 19 and 20 have been shown. In a way known per se, electrodes 19 and 20 are formed of thin metal strips, for example of a few tens of millimeters, generally designated under the name of "foil".

Each terminal 17, 18 has an annular shape and is disposed in the vicinity of axis X—X, with which it is coaxial. Moreover, said terminals 17 and 18 are each, respectively and at least approximately, in the plane of the end faces 21 or 22 of capacitor 7. Thus, the axial space required by each stage may be minimum.

The annular terminal 17 of each stage is connected, by a plurality of radial electrodes 19 (see FIG. 3 on which it has been assumed that coating 8 has been removed), to the external periphery 23 of the corresponding capacitor 7. Electrodes 19 are therefore long. They comprise a flat elongate portion 19a, parallel to the corresponding end face 21 of the associated capacitor 7, and spaced there from by a distance d. However, to reach the annular terminal 17, it must comprise in addition an inclined central portion 19b, connected to the flat portion 19a by a bend 19c, situated in the vicinity of the internal periphery 24 of said capacitor 7.

Figure 3:
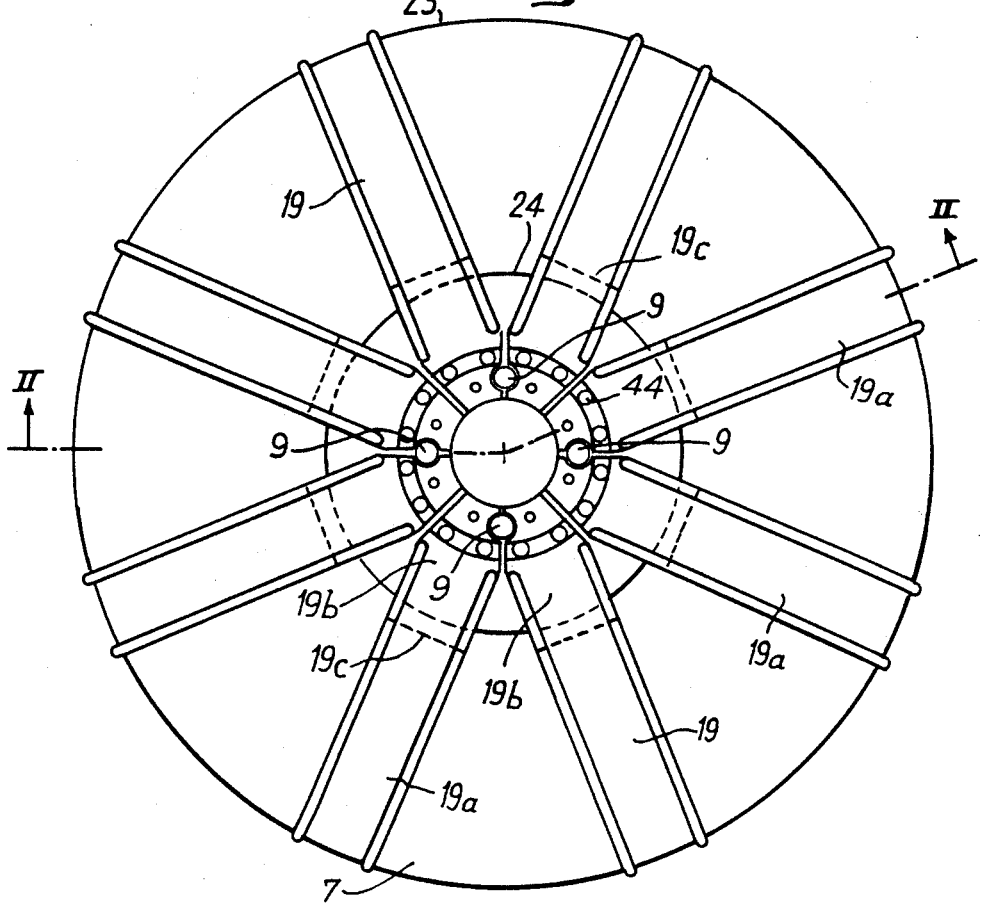
FIG. 3 is a front view of a capacitor of such a stage, showing the distribution of the long electrodes.

Furthermore, the annular terminal 18 of each capacitor stage is connected, by a plurality of radial electrodes 20 (whose star arrangement is not shown but is advantageously similar to that of the electrodes 19, such as shown in FIG. 3), to the internal periphery 24 of a corresponding capacitor 7. Electrodes 20 are therefore shorter than electrodes 19. In addition, since they are housed inside said internal periphery 24, they may be rectilinear over the whole of their length.

Terminals 17 and 18 are respectively connected to spark-gap heads 25 or 26, housed in the central recess 27 of the capacitor stages and disposed so that the spark-gap head 25 of one stage may cooperate with the spark-gap head 26 of the following stage, said spark-gap heads 25 and 26 being disposed opposite each other.

Furthermore, grooves 28 may be formed in the wall of said central recess 27 so as to eliminate electric conduction by skin effect.

Figure 4:
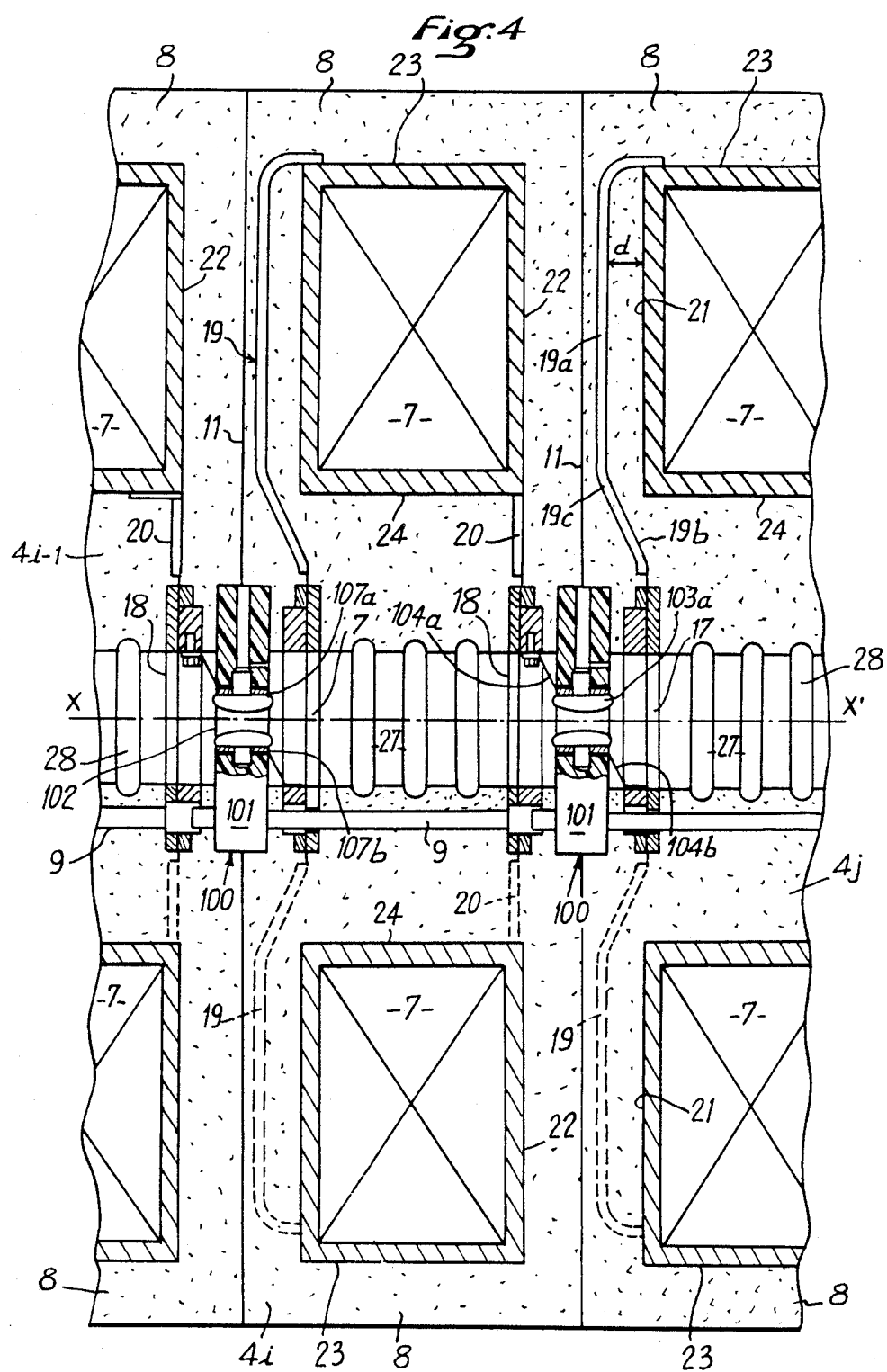
FIG. 4 a view similar to FIG. 2, showing spark-gap assemblies in accordance with the invention.

As can be seen by a comparison of FIGS. 2 and 4, the Marx generator of the invention (FIG. 4) is distinguished from the known Marx generator (FIG. 2) by the arrangement of each pair of associated spark-gap heads in a single unit 100, mechanically independent of the corresponding capacitor stages. The parts identical to those of the generator of FIG. 2, designated in FIG. 4 by the same references, will not be described again.

As can be best seen in FIGS. 5 to 8, a spark-gap assembly 100 comprises an insulating support in the form of a torus 101, in the central recess 102 of which the two respective head bodies 103a and 103b of the pair of associated spark-gap heads are mounted opposite each other, which head bodies are intended to be connected respectively to two adjacent capacitor stages of the generator, by bent electric connecting strips 104a and 104b. In addition, each spark-gap head 103a, 103b is provided with a threaded rod 105a, 105b, by means of which it may be removably mounted in a corresponding bore 106a, 106b of support 101. Either a channel 131 for injecting a blocking product in the bore or a locking screw may be provided.

Furthermore, between the base of each spark-gap head body 103a, 103b and the corresponding surface portion of the central recess 102 of the insulating support 101, a shim 107a, 107b is provided for adjusting the spacing of the head bodies 103a, 103b.

Each connecting strip 104a, 104b comprises a first flat portion 110 with a hole 111 for passing the threaded rod 105a, 105b therethrough, a central inclined portion 112 and a second flat portion 113 parallel to the first one 110, having a recess 113 for fixing the strip to the corresponding electrode 17, 18 (FIG. 8).

The connecting strips must be sufficiently flexible to make it possible to fix them mechanically for accommodating the manufacturing tolerances of the different parts present, and sufficiently rigid so as to guarantee a geometry after fitting corresponding to the magnetic field phenomena already mentioned in the French patent application 87 14374 of the same Applicant. For this, the connecting strips are made from a good electricity conducting metal material in the form of a foil bent to the required dimensions using known techniques.

FIGS. 9a to 9D illustrate the different steps of the method of fitting a spark-gap assembly of the invention between two capacitor stages of the Marx generator shown in FIG. 4.

Figure 9A:
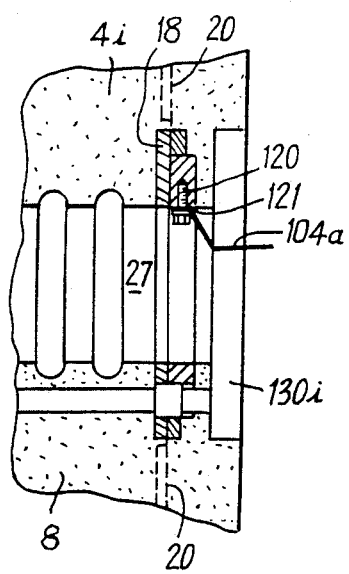
FIGS. 9a to 9d illustrate the different steps of the method of fitting the spark-gap assembly of the invention in a Marx generator.
Figure 9B:
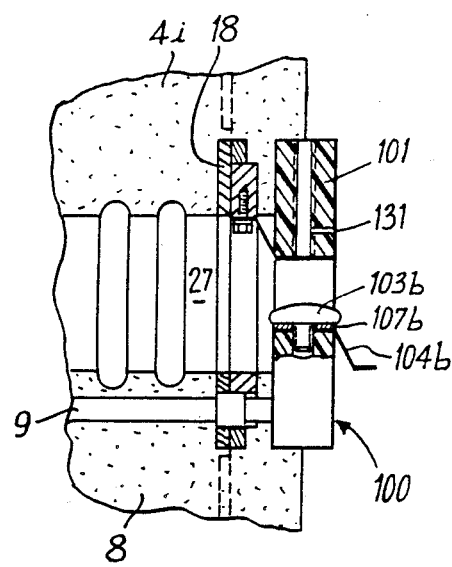
Figure 9C:
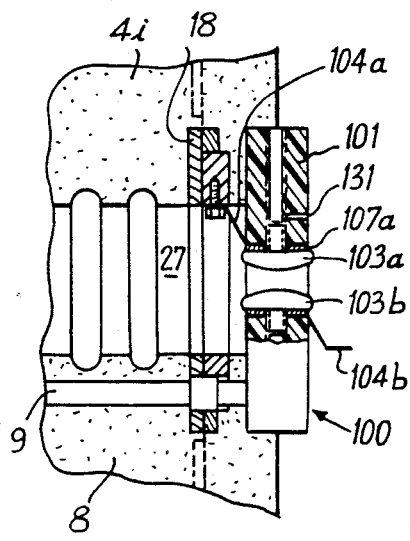
Figure 9D:
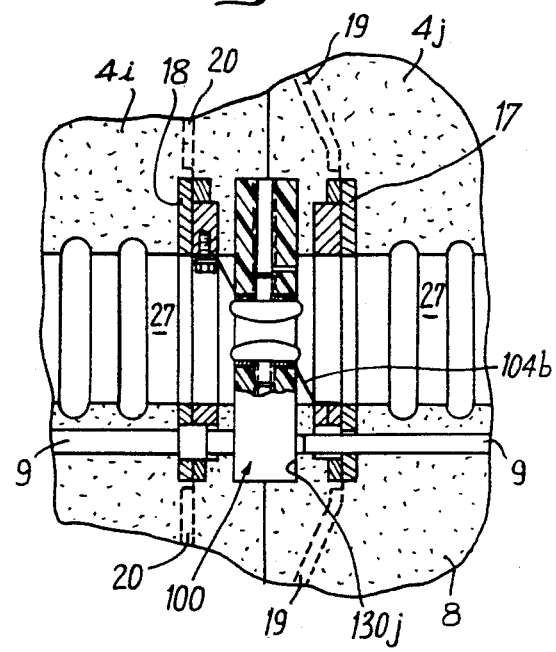

Spark-gap assembly 100, such as shown in FIGS. 5 to 7, is previously adjusted as regards the spacing of the head bodies 103a, 103b by adjusting the thickness of shims 107a, 107b, then, a first head body 103a of the spark-gap assembly is removed, with its shim 107a, thus freeing the corresponding connecting strip 104a, which may be mounted on the terminal 18 of this stage 4i and fixed there by means of a screw 120 and a washer 121 (FIG. 9a). Then, the spark-gap assembly 100, equipped with the second head body 103b with its shim 107b and its connecting strip 104b, is mounted in the recess 130i provided for this purpose in stage 4i and is there fixed by means of tie-rods 9 (FIG. 9b) passing through the bores 140. Then, the first head body 103a and its shim 107a may be refitted on the assembly 100 by nipping the corresponding connecting strip 104a between shim 107a and the corresponding surface portion of the central recess of the insulating support 101, the first head body 103a being locked by injecting a blocking product in channel 131 (FIG. 9c). Then, the next capacitor stage 4j is fitted, the toric support 101 centering it on the spark-gap assembly 100, and it is there fixed by means of tie-rods 9. The toric support 101 thus plays the role of the centering piece 10 in the known Marx generator of FIG. 2 and is housed in the recess 130j of corresponding shape of stage 4j. Finally, the connecting strip 104b of the second head body 103b is fixed on the corresponding terminal 17 of stage 4j (FIG. 9d).

Thus, the spacing of the spark-gap head 103a, 103b is that defined by previous adjustment, by means of shims 107a, 107b and the electric connection of each head body 103a, 103b with the corresponding capacitor stage 4i, 4j is provided by the connecting strips 104a, 104b.

What is claimed is:

1. A Marx generator of the type comprising:
   a sealed case inside which prevails an atmosphere of a dielectric gas,
   a plurality of capacitor stages, of toric shape, arranged in said case coaxially to a common axis and juxtaposed along said axis,
   each capacitor stage having a capacitor, embedded in a dielectric coating, in the form of a ring, and connected by a plurality of electrodes to two annular terminals coaxial with said axis,
   said terminals being connected respectively to spark-gap heads housed in the central recess of the capacitor stages, each capacitor stage comprising two spark-gap heads, one of which cooperates with a spark-gap head of the preceding stage and the other cooperates with a spark-gap head of the following stage so as to form each time a pair of associated spark-gap heads, wherein said spark-gap heads of each of said pairs of associated spark-gap heads are mounted on the same insulating support, so as to be connected mechanically together.

2. The Marx generator as claimed in claim 1, wherein each of said pairs of associated spark-gap heads forms a single unit removably housed in a recess provided at the interface of two consecutive stages.

3. The Marx generator as claimed in claim 2, wherein said recess is formed of two recess halves formed respectively in one and other of said consecutive stages.

4. The Marx generator as claimed in claim 1, wherein each pair of associated spark-gap heads comprises two spark-gap head bodies disposed opposite each other, respectively on each side of the axis common to the capacitor stages and symmetrically with respect to said axis.

5. The Marx generator as claimed in claim 4, wherein each spark-gap head body is connected to a corresponding electrode by a bent connecting strip.

6. The Marx generator as claimed in claim 4, wherein said insulating support has a toric shape, in the central recess of which said head bodies are mounted.

7. The Marx generator as claimed in claim 6, wherein each spark-gap head body is provided with a threaded rod, by means of which it can be mounted in a corresponding bore of said support.

8. The Marx generator as claimed in claim 6, wherein said connecting strip is clamped between the base of the spark-gap head body and the corresponding surface portion of the central recess of the insulating support.

9. The Marx generator as claimed in claim 8, wherein, between the base of the spark-gap head body and said corresponding surface portion of the central recess of the insulating support, a shim is provided for adjusting the spacing of the head bodies.

10. Spark-gap assembly for a Marx generator comprising:

a sealed case inside which prevails an atmosphere of a dielectric gas, a plurality of capacitor stages, of toric shape, arranged in said case coaxially to a common axis and juxtaposed along said axis, each capacitor stage having a capacitor, embedded in a dielectric coating, in the form of a ring, and connected by a plurality of electrodes to two annular terminals coaxial with said axis, said terminals being connected respectively to spark-gap heads housed in the central recess of the capacitor stages, each capacitor stage comprising two spark-gap heads, one of which cooperates with a spark-gap head of the preceding stage and the other cooperates with a spark-gap head of the following stage so as to form each time a pair of associated spark-gap heads, wherein said spark-gap assembly is formed of said pair of associated spark-gap heads mounted on the same insulating support so as to form a single unit.

11. The spark-gap assembly as claimed in claim 10, wherein said insulating support is in the form of a torus, in the central recess of which the two respective head bodies of said pair of associated spark-gap heads are mounted facing each other, which head bodies are intended to be connected respectively to two adjacent capacitor stages of said generator.

12. The spark-gap assembly as claimed in claim 11, wherein each spark-gap head is provided with a threaded rod by means of which it may be mounted in a corresponding bore of said support.

13. The spark-gap assembly as claimed in claim 11, wherein a bent connecting strip is clamped between the base of the spark-gap head body and a corresponding surface portion of the central recess of the insulating support, which connecting strip is intended to connect the spark-gap head body to the corresponding electrode.

14. The spark-gap assembly as claimed in claim 11, wherein, between the base of the spark-gap head body and said corresponding surface portion of the central recess of the insulating support, a shim is provided for adjusting the spacing of the head bodies.

15. Method of fitting a spark-gap assembly in a Marx generator, comprising:

a sealed case inside which prevails an atmosphere of a dielectric gas, a plurality of capacitor stages, of toric shape, arranged in said case coaxially to a common axis and juxtaposed along said axis, each capacitor stage having a capacitor, embedded in a dielectric coating, in the form of a ring, and connected by a plurality of electrodes to two annular terminals coaxial with said axis, said terminals being connected respectively to spark-gap heads housed in the central recess of the capacitor stages, each capacitor stage comprising two spark-gap heads, one of which cooperates with a spark-gap head of the preceding stage and the other cooperates with a spark-gap head of the following stage so as to form each time a pair of associated spark-gap heads, said spark-gap assembly forming a single unit, being formed of said pair of spark-gap heads mounted on the same insulating support in the form of a torus, in the central recess of which the two respective head bodies of said pair of associated spark-gap heads are arranged facing each other, which head bodies are intended to be connected respectively by a bent connecting strip to two adjacent capacitor stages of said generator, which method comprises the following steps:

the spacing between the spark-gap head bodies is previously adjusted, a first head body is removed, thus releasing its connecting strip which is mounted on the corresponding terminal of the capacitor stage to be equipped, then, in the recess provided for this purpose in said stage is fitted the spark-gap assembly with the second head body, the first head body is then refitted on the assembly by nipping the associated connecting strip between the head body and the support, then, the next capacitor stage is fitted, the toric support centering it on the spark-gap assembly, and the connecting strip of the second head body is connected to the corresponding terminal of the last capacitor stage fitted.

16. The method as claimed in claim 15, wherein said first head body is locked by injection of a blocking product therein.

* * * * *